(12) United States Patent
Abbaspour et al.

(10) Patent No.: US 7,814,448 B2
(45) Date of Patent: Oct. 12, 2010

(54) REPRESENTING AND PROPAGATING A VARIATIONAL VOLTAGE WAVEFORM IN STATISTICAL STATIC TIMING ANALYSIS OF DIGITAL CIRCUITS

(75) Inventors: Soroush Abbaspour, Fishkill, NY (US); David J. Hathaway, Underhill, VT (US); Chandramouli Visweswariah, Croton-on-Hudson, NY (US); Jinjun Xiong, White Plains, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 811 days.

(21) Appl. No.: 11/733,058

(22) Filed: Apr. 9, 2007

(65) Prior Publication Data

US 2008/0250370 A1 Oct. 9, 2008

(51) Int. Cl.
G06F 17/50 (2006.01)
(52) U.S. Cl. .......................................... 716/6
(58) Field of Classification Search ............... 716/6
See application file for complete search history.

(56) References Cited

U.S. PATENT DOCUMENTS

| 6,684,375 B2 | 1/2004 | Tsukiyama et al. |
| 7,127,385 B2 * | 10/2006 | Komoda et al. ............ 703/19 |
| 2004/0243954 A1 | 12/2004 | Devgan et al. |
| 2005/0065765 A1 | 3/2005 | Visweswariah |
| 2005/0066296 A1 | 3/2005 | Visweswariah |

OTHER PUBLICATIONS

Jain et al., "Accurate Delay Computation for Noisy Waveform Shapes," ICCAD, 2005, pp. 946-952, IEEE.
Hashimoto, et al., "Equivalent Waveform Propagation for Static Timing Analysis," ICCAD, Apr. 2003, pp. 169-175, ACM.
Amin et al., "Weibull Based Analytical Waveform Model," ICCAD, Aug. 2003, pp. 161-168, ACM.
Nassif et al., "Advanced Waveform Models for the Nano-Meter Regime," TAU, 2004, 6 pages, IBM Research, Austin, TX.
Fatemi et al, "Statistical Logic Cell Delay Analysis Using a Current-Based Model," DAC, Jul. 2006, pp. 253-256, California.
Gandhi et al., "Delay Modeling Using Ramp and Realistic Signal Waveforms," Electro Information Technology, May 2005 IEEE, 5 pages.

(Continued)

*Primary Examiner*—Stacy A Whitmore
(74) *Attorney, Agent, or Firm*—Stephen Kaufman; Hoffman Warnick LLC

(57) ABSTRACT

An approach that represents and propagates a variational voltage waveform in statistical static timing analysis of digital circuits is described. In one embodiment, there is a statistical static timing analysis tool for analyzing digital circuit designs. The statistical static timing analysis tool includes a variational waveform modeling component that is configured to generate a variational waveform model that approximate arbitrary waveform transformations of waveforms at nodes of a digital circuit. The variational waveform model transforms a nominal waveform into a perturbed waveform in accordance with a plurality of waveform transformation operators that account for variations that occur between the nominal waveform and the perturbed waveform. A variational waveform propagating component is configured to propagate variational waveforms through a timing arc from at least one input to at least one output of the digital circuit in accordance with the variational waveform model.

15 Claims, 8 Drawing Sheets

OTHER PUBLICATIONS

Lin et al., "h-gamma: An RC Delay Metric Based on a Gamma Distribution Approximation of the Homogeneous Response," ICCAD 1998, pp. 1-7, ACM.

Visweswariah et al., "First-Order Incremental Block-Based Statistical Timing Analysis," DAC, Jun. 2004, pp. 331-336, ACM, San Diego, California.

Conn et al., "Gradient-Based Optimization of Custom Circuits Using a Static-Timing Formulation," DAC, Jun. 1999, 8 pages.

Zolotov et al, "Noise Injection and Propagation in High Performance Designs," ISQED, Mar. 2002, 6 pages, IEEE.

Keller et al, "A Robust Cell-Level Crosstalk Delay Change Analysis," Mar. 2004, pp. 147-154, IEEE.

Croix et al, "Blade and Razor: Cell and Interconnect Delay Analysis Using Current-Based Models," DAC, Jun. 2003, pp. 386-389, ACM.

Agarwal et al, "Statistical Timing Analysis Using Bounds," 2003, 6 pages, Design, Automation and Test in Europe Conference and Exhibition (DATE), IEEE.

Chang et al, "Parameterized Block-Based Statistical Timing Analysis with Non-Gaussian Parameters, Nonlinear Delay Functions," DAC, Jun. 2005, pp. 71-76, ACM, Anaheim, California.

* cited by examiner

REPRESENTING AND PROPAGATING A VARIATIONAL VOLTAGE WAVEFORM IN STATISTICAL STATIC TIMING ANALYSIS OF DIGITAL CIRCUITS

BACKGROUND

This invention relates generally design automation of Very Large Integrated Circuits (VLSI), and more particularly to waveform modeling and propagation in statistical static timing analysis of digital circuits.

Static timing analysis (STA) has been used to verify the timing correctness of VLSI circuits. In particular, STA analyzes the VLSI circuits to determine the earliest and latest possible signal arrival times on each logic path or node by propagating signals throughout the gates and interconnects that form the path. The accuracy of timing analysis is heavily dependent on the modeling and propagation of digital signals throughout a design timing graph. The most common and widely used model for transition waveforms of digital signals is the well-known saturated ramp model. The use of the saturated ramp model eases the timing analysis since each voltage waveform is uniquely defined by its arrival time and transition time, also referred to as slew.

However, in a real design, the digital signal's shape could be very different from that of the saturated ramp. The actual shape of the gate or interconnect output signals depends on many factors including: the input signal waveform applied to the gate or interconnect, the gate and interconnect topology, the nonlinearities of the gate input capacitances, the coupling and power supply noise, etc.

It has been shown that the saturated ramp model is not sufficiently accurate for modeling the complex behavior of signals in high speed deep submicron VLSI circuits. Approximating signal waveforms by saturated ramps can incur as much as 19% error in final timing results. To overcome this problem, there have been several attempts to represent signal waveforms with more advanced models; such as piecewise linear waveforms, Weibull, Gamma and even arbitrary functions. These proposed models have helped to reduce the error of calculating arrival times by as much as 50-80%. These modeling techniques are advantageous, in particular, for static timing with a current source driver model or transistor level timing (TLT) analysis. Both the current source driver model and TLT analysis can easily handle complex waveforms and provide higher accuracy when operating with advanced waveform models. These models have also been employed for accurate coupling noise analysis as well as signal propagation through interconnects.

As complementary metal-oxide-semiconductor (CMOS) technology moves toward ultra deep sub-micron (UDSM) technologies, variability becomes the major obstacle for designing high-performance VLSI circuits. Therefore, there is a need for an advanced analysis tool which is capable of handling variability that stems from imperfect CMOS manufacturing processes, environmental factors, and device fatigue phenomena. Variability makes it difficult to verify that a chip will function correctly before releasing it for manufacturing.

Statistical static timing analysis (SSTA) is one approach that addresses issues associated with variability. As with its STA counterpart, today's SSTA tools only propagate two components of the digital signals (i.e., arrival time and transition time) by interpreting them as random variables or, perhaps, functions of process parameters modeled as random variables. Despite improving the accuracy of STA, advanced models of signal waveforms are still not very popular for SSTA since SSTA requires variational waveform modeling. The variational waveform modeling can be easily constructed for saturated ramp models of signal waveforms by representing signal transition times and arrival times as random quantities. However, the extension to the advanced models is not straightforward. For instance, one can model the signals with an exponential function and evaluate the timing constant of the exponent as a random quantity. This timing constant is proportional to the slew of a saturated ramp signal. However, an exponential waveform model has only marginal accuracy benefits compared to a traditional saturated ramp model and is not appropriate to mimic the accuracy of more advanced waveform models.

Modeling arbitrary signal waveforms with random functions due to the effect of environmental and process variations has also been studied for use in SSTA. In particular, it has been proposed to consider the crossing time of each point of the signal transition as a random quantity. To do that, the signal waveforms are modeled with Marcovian random processes. However, the definition of Marcovian random processes is too broad and contains a wide range of random functions. One of the main features of a Marcovian process is the dependence of each point only on its immediate history. This dependency is statistical, which means that probabilities of the new state depend on the previous states. Waveforms in manufactured chips belong to much narrower class of random functions. Their main property is the fact that the waveform shape can be fully determined by the actual values of environmental and process parameters. In addition, proposed point-wise variational waveform modeling is not efficient for SSTA since each signal is represented with rather a large number of random quantities in canonical, or first order linear, forms. This type of variational waveform modeling results in high memory consumption and it is highly inefficient for production use.

Therefore, there is a need for a modeling technique for waveform variation that can be used for SSTA.

SUMMARY

In one embodiment, there is a method for statistical static timing analysis of a digital circuit. In this embodiment, the method comprises: developing a variational waveform model to approximate arbitrary waveform transformations of waveforms at nodes of the digital circuit, wherein the variational waveform model transforms a nominal waveform into a perturbed waveform in accordance with a plurality of waveform transformation operators that account for variations that occur between the nominal waveform and the perturbed waveform; and propagating variational waveforms through a timing arc from at least one input to at least one output of the digital circuit in accordance with the variational waveform model.

In a second embodiment, there is a computer-readable medium storing computer instructions, which when executed, enables a computer system to perform a statistical static timing analysis of a digital circuit. In this embodiment, the computer instructions comprises developing a variational waveform model to approximate arbitrary waveform transformations of waveforms at nodes of the digital circuit, wherein the variational waveform model transforms a nominal waveform into a perturbed waveform in accordance with a plurality of waveform transformation operators that account for variations that occur between the nominal waveform and the perturbed waveform; and propagating variational waveforms through a timing arc from at least one input to at least one output of the digital circuit in accordance with the variational waveform model.

In a third embodiment, there is a statistical static timing analysis tool for analyzing digital circuit designs. In this embodiment, the tool comprises a variational waveform modeling component that is configured to generate a variational waveform model that approximate arbitrary waveform transformations of waveforms at nodes of a digital circuit. The variational waveform model transforms a nominal waveform into a perturbed waveform in accordance with a plurality of waveform transformation operators that account for variations that occur between the nominal waveform and the perturbed waveform. A variational waveform propagating component is configured to propagate variational waveforms through a timing arc from at least one input to at least one output of the digital circuit in accordance with the variational waveform model.

DETAILED DESCRIPTION

Embodiments of this invention are directed to a general, compact, and efficient variational waveform modeling technique that represents the voltage variation between the source pin and the sink pin of a gate or an interconnect in a VLSI circuit. This variational waveform modeling technique can handle the effect of environmental and manufacturing process sources of variation including the power and ground voltage variations.

Figure 1:
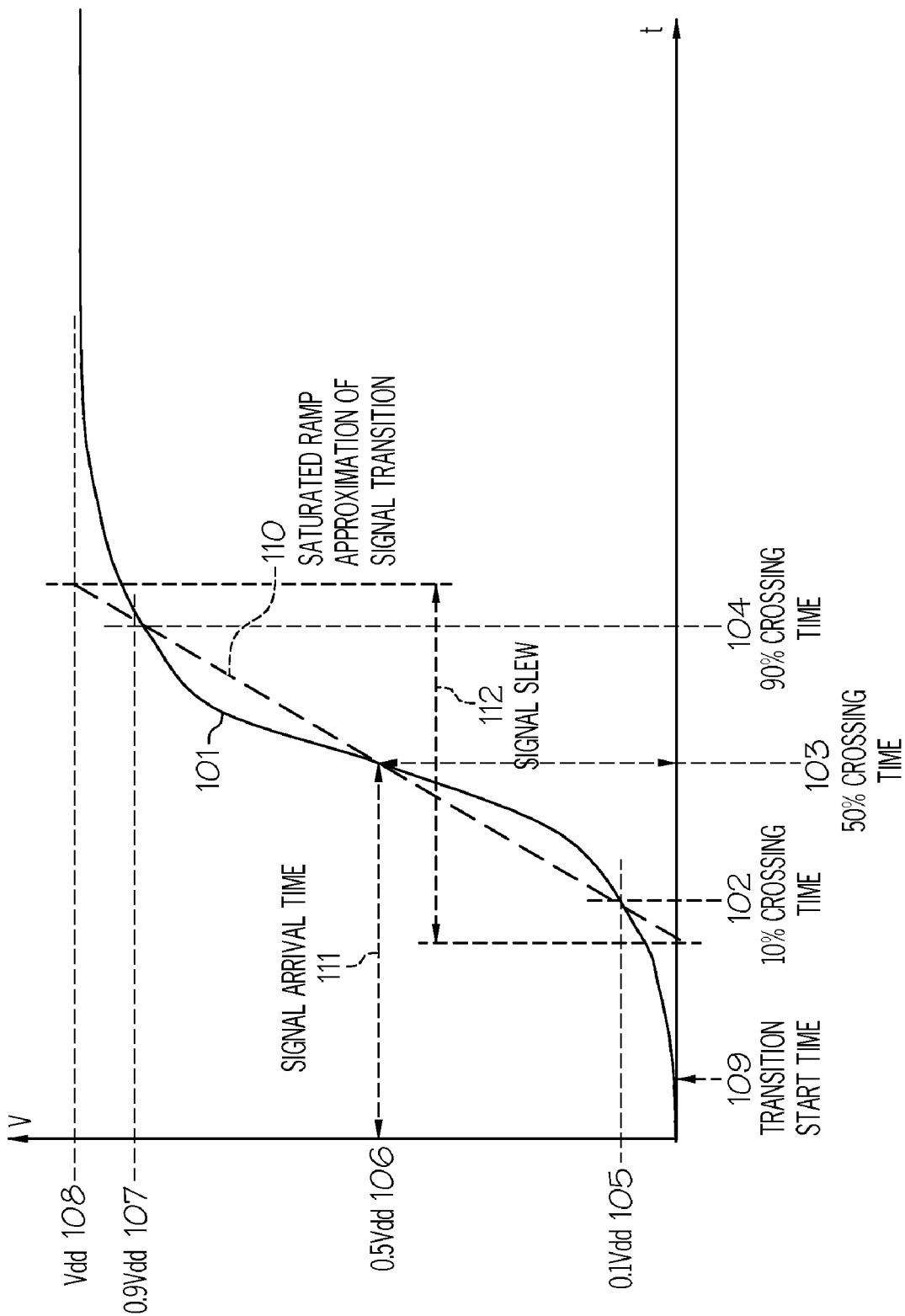
FIG. 1 illustrates a transient voltage waveform and its saturated ramp approximation.

FIG. 1 illustrates a transient voltage waveform and its saturated ramp approximation. In particular, FIG. 1 shows an exemplary signal transition 101 that would be produced by STA at a point within a circuit as it propagates timing information from circuit primary inputs to circuit primary outputs. Without loss of generality, it is assumed that the signal waveform 101 is monotone. Any signal waveform can be determined by its crossing time points, 102, 103, 104, i.e., time values by which the signal crosses selected voltage levels, 105, 106, 107, respectively. Voltage levels are usually expressed in fractions or percentile of a supply voltage (Vdd) 108. The latest crossing time point corresponding to 0% (100%) point of Vdd for rising (falling) transition is referred to as transition start time 109.

A saturated ramp model 110 is one well-known model that presents the digital signals. In the case of saturated ramp modeling, the signal transition is specified by its arrival time 111 and slew 112. The signal arrival time 111 is usually defined as the time when the signal crosses 50% point of Vdd 106 while the signal slew 112 is the duration of the ramp. There are several ways to approximate a signal waveform with a saturated ramp. For instance, a signal waveform might be approximated with a saturated ramp with the same 50% crossing point as the original waveform. The approximated ramp transition time may also be computed as the time difference between 10% of Vdd 105 and 90% of Vdd 107, crossing points of the original waveform multiplied by 1.25.

In real circuit scenarios, the signal arrival time and transition time in the design depend on many different factors including the technology and manufacturing process parameters. Due to the statistical nature of technology and manufacturing process parameters, modeling with random variables with determined probability distributions may be used. In parameterized SSTA, every timing quantity (e.g. arrival times, required arrival times, delays, slews) is represented in the first order canonical form as shown in equation 1:

$$A = a_0 + \sum_{i=1}^{n} a_i \cdot \Delta X_i + a_R \Delta R_a \quad (1)$$

where:

A is the timing quantity in the first order canonical format;

$a_0$ is the nominal value of the timing quantity A;

$\Delta X_i = X_i - \hat{X}_i$ is the variation of $i^{th}$ sources of variation, $X_i$, from its nominal value $\hat{X}_i$;

$a_i$ is the sensitivity of the timing quantity A to the process parameter $X_i$;

$\Delta R_a$ is the normalized (zero mean and unit sigma) random variable used to model the uncorrelated variation in quantity A.

$a_R$ is the sensitivity of the timing quantity A to the uncorrelated variation $\Delta R_a$.

The sources of variation, $\Delta X_i$, in the first order canonical form are usually assumed to have Gaussian distributions with zero means and unit standard deviations. The first order canonical form can be extended to handle non-Gaussian distributions and also to capture the nonlinear dependency of the timing quantities to the sources of variations. In one embodiment of this invention, the concept of first order canonical form is exercised with Gaussian sources of variations for further discussions and can be easily extended to non-Gaussian sources of variation as well as the nonlinear dependence of the timing quantities to the sources of variation.

Figure 2A:
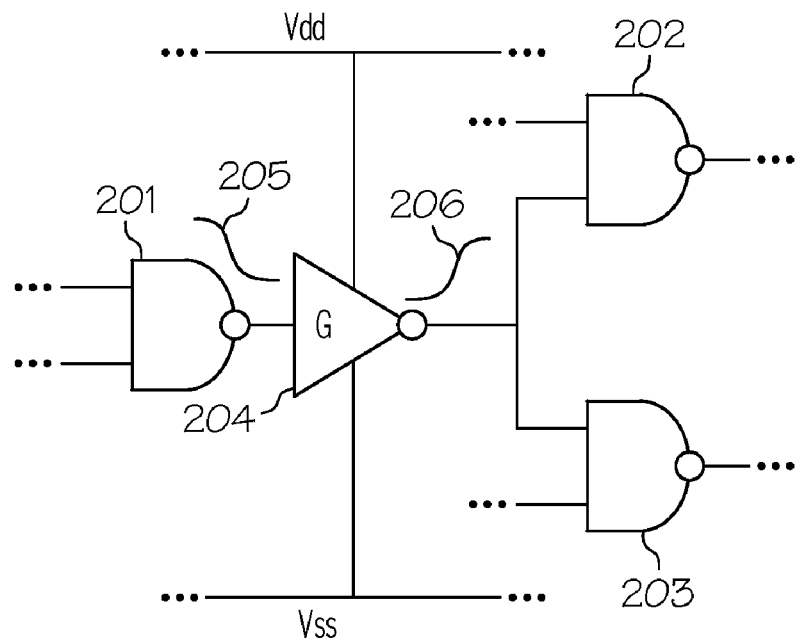
FIGS. 2A-2B show a circuit fragment and perturbation of its signal waveform due to environmental and manufacturing process variation.
Figure 2B:
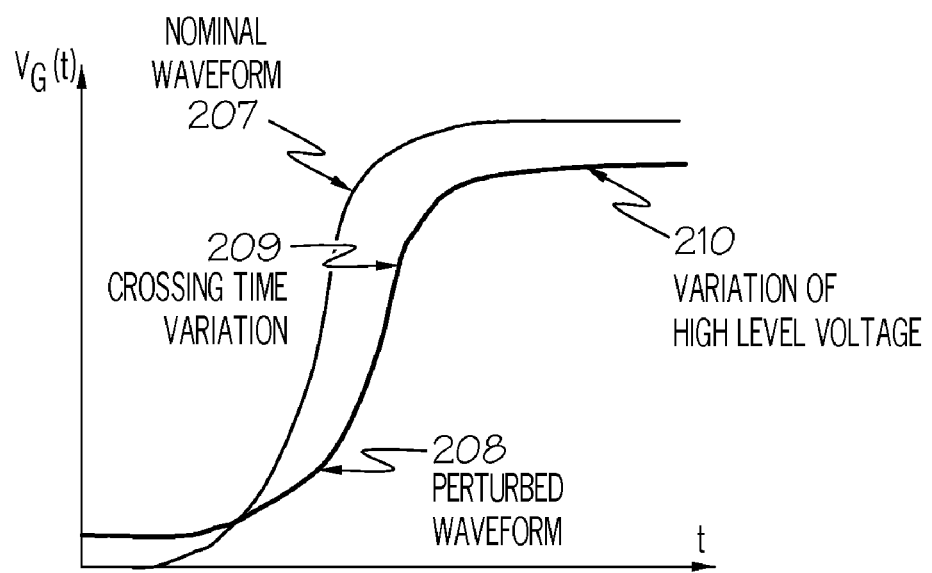

FIGS. 2A-2B show a circuit fragment and perturbation of its signal waveform due to environmental and manufacturing process variation. In particular, FIG. 2A shows a partition of a CMOS design with interconnected NAND gates 201, 202, 203, and inverter gate 204. Without loss of generality, FIG. 2A shows the signal waveform 206 at the output terminal of the inverter 204. It is assumed that the nominal waveform in the design is obtained by setting the sources of variation to their nominal values ($\hat{X}_1, \hat{X}_2, \ldots$). As shown in FIG. 2B, the nominal voltage waveform 207 at the output terminal of the inverter G 204 is denoted by $V_{G,nom}(t)$. In addition, FIG. 2B shows the perturbed voltage waveform (e.g., due to the variation of process parameters) 208 at the output terminal of the inverter G 204 by $V_G(t)$ 208. Also, as shown in FIG. 2(B), crossing times 209 of the perturbed voltage waveform $V_G(t)$ 208 for the same voltage level could be different from the corresponding crossing times of the nominal waveform $V_{G,nom}(t)$ 207. It should be added that the variation in the ground and supply voltages may cause the voltage levels of the perturbed waveform to be different from its nominal one 210.

As mentioned above, the variation in perturbed waveform $V_G(t)$ is a function of many factors including: 1) the variations in the gate input waveform, 2) the variations in gate process parameters, 3) the variations in the gate output load, 4) the variations in supply and ground voltages (Vdd and Vss), etc. Variation in the power supply and ground voltage levels not only cause changes to the crossing times of the gate output waveform $V_G(t)$ but also its voltage levels. In contrast, variation of the gate parameters and gate input voltage waveform only affects the crossing times of the perturbed waveform, $V_G(t)$ and not the voltage levels. This is valid under the assumption that the leakage current is negligible.

In one embodiment of this invention, it is assumed that $T_{var}$ is the operator that transforms the nominal waveform $V_{nom}(t)$ into the perturbed waveform, $V(t)$, due to the effect of process variation as shown in equation 2:

$$xT_{var}:V_{nom}(t) \mapsto V(t) \qquad (2)$$

The following are the steps to develop a variational signal waveform model:

1. A set, S, of primitive waveform transformation operators $T_{prim,1}, T_{prim,2}, \ldots$ is constructed where each of these operators is in charge of the basic variations of waveforms. None of these operators can be obtained with the superposition of the other operators in the set. Each of these operators has a parameter which defines its amount of change to the nominal waveform. Unit values of the parameters used to define the amount of change for each operator form a basis set for a waveform variation space.

2. Gven an arbitrary waveform transformation operator T, it is approximated with an optimal superposition of the primitive operators $T_{prim,1}, T_{prim,2}, \ldots$ such that it results in a minimum approximation error. This technique will help to focus on a smaller set of operators (i.e. only on the primitive operators) instead of dealing with an arbitrary waveform operator.

3. Next, a set of techniques are developed to propagate variational waveforms through gates and interconnects.

As an example, transformation of any saturated ramp signal into another saturated ramp signal is done by transforming the arrival time and slew of the nominal saturated ramp signal. These basic transformation operators are called "time shifting" and "time stretching". Time shifting operator shifts each crossing time of the original waveform by the same amount. Time stretching operator multiplies all the crossing times by a same factor, thereby, affecting the nominal waveform transition time. These two transformations are used to generate a variety of waveforms from a small set of base signal waveforms.

Figure 3A:
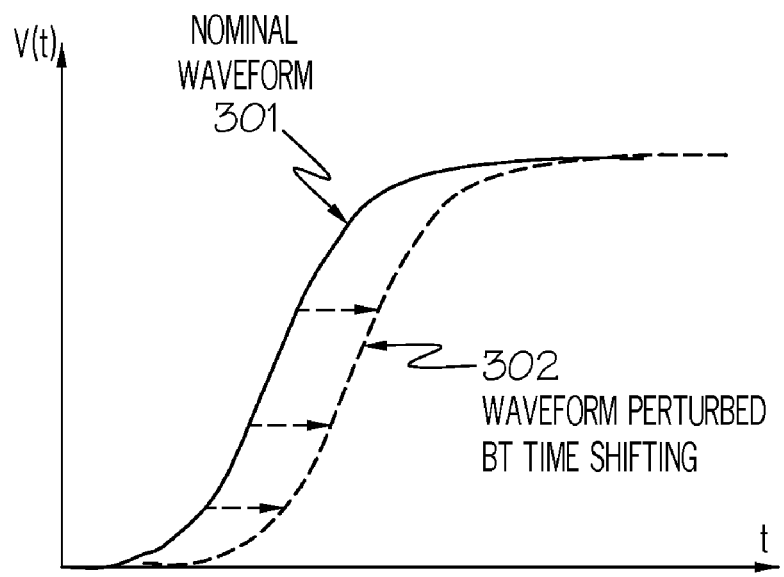
FIGS. 3A-3D demonstrate examples of primitive waveform transformation operators that can be used with the SSTA according to one embodiment of this invention.
Figure 3B:
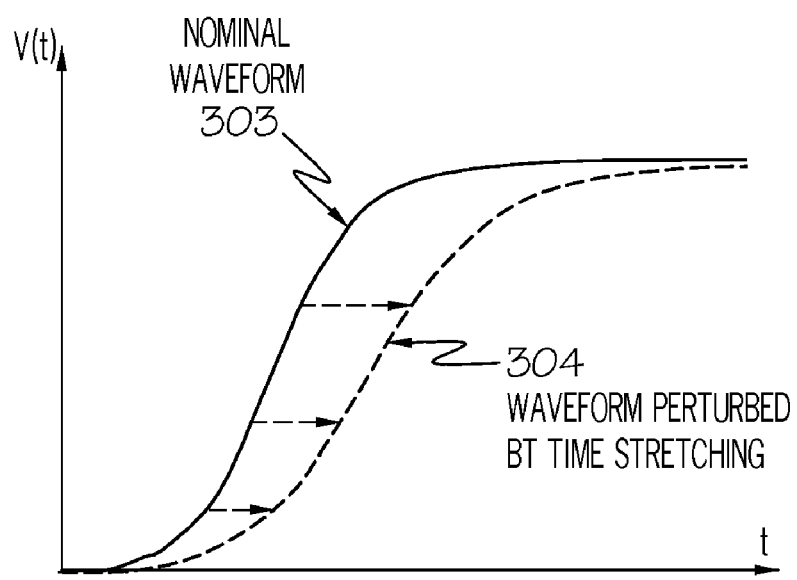

Applying the same technique, it is possible to duplicate any waveform transformation operator T with an optimal superposition of "time shifting" $S_t$ and "time stretching" $M_t$ operators. FIGS. 3A and 3B illustrate the time shifting and time stretching operators. Consider signal waveform $V_{nom}(t)$ with start time $t_0$. Assuming that the time shifting operator $S_t$ that shifts the nominal waveform $V_{nom}(t)$ by the value B is shown in equation 3:

$$S_t(B):V_{nom}(t) \mapsto V(t)=V_{nom}(t-B) \qquad (3)$$

Similarly, suppose the time stretching operator $M_t$ that stretches the nominal waveform $V_{nom}(t)$ by a factor A is expressed as follows in equation 4:

$$M_t(A):V_{nom}(t) \mapsto V(t)=V_{nom}(t-A\cdot(t-t_0)) \qquad (4)$$

If B is a positive (negative) value, then the "time shifting" operator shifts every crossing time point of the nominal waveform, 301, and, thereby, the arrival time by the same amount B toward the right-hand (left-hand) side. For instance, if B=10 ps, every crossing time points are delayed by 10 ps and, thereby, the arrival time of the shifted waveform, 302, is 10 ps greater than the arrival time of the nominal waveform, 301. If A is positive value, the "time stretching" operator makes the transition time of the stretched waveform, 304, slower than that of the nominal waveform, 303, since each crossing point of the nominal waveform is delayed by an amount proportional to its time distance from the transition start time $t_0$. For instance, if A=0.1, the crossing time points are delayed by 10% relative to the transition start time. If A is negative, the transition is speeded up (i.e. the slew will decrease).

Figure 3C:
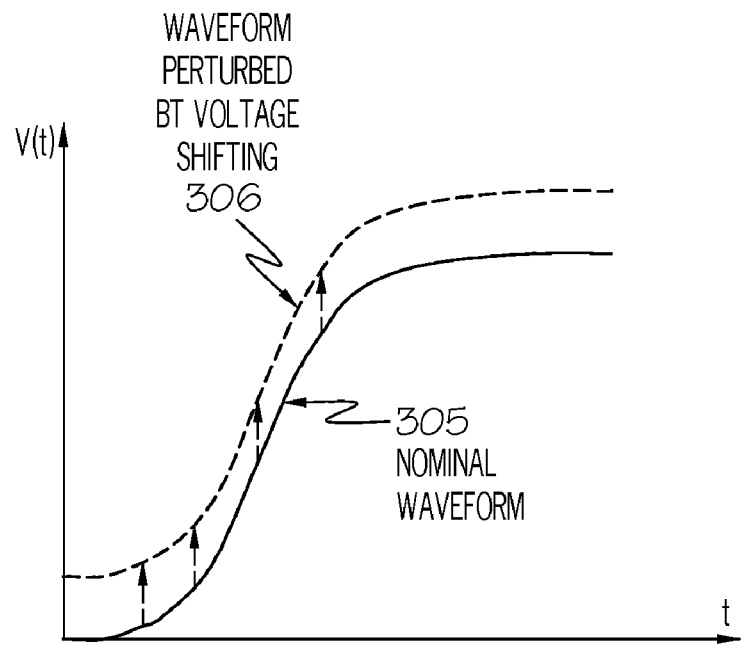

Apparently, time shifting and stretching operators cannot model the waveform perturbations caused by power and ground voltage variations. In order to model these types of waveform transformations, voltage shifting $S_V$ and voltage stretching $M_V$ operators are introduced. The voltage shifting operator models waveform perturbation due to bouncing of ground voltage Vss. The voltage stretching operator models waveform perturbation due to the variation of the difference between supply and ground voltages Vdd-Vss which usually happens due to power grid voltage drop. The transformation of the nominal waveform by voltage shifting operator $S_v$ is represented as follows in equation 5:

$$S_v(D):V_{nom}(t) \mapsto V(t)=V_{nom}(t)+D\cdot V_{dd,nom} \qquad (5)$$

where parameter D defines the amount of voltage shift as a fraction of nominal supply voltage $V_{dd,nom}$. D=0 means no voltage shift and D=0.1 means that the nominal waveform, 305, is shifted up by 10% of $V_{dd,nom}$, thereby, the voltage levels of the shifted waveform, 306, are both greater than the voltage levels of the nominal waveform, 305, by the 10% of the supply voltage (FIG. 3C).

Figure 3D:
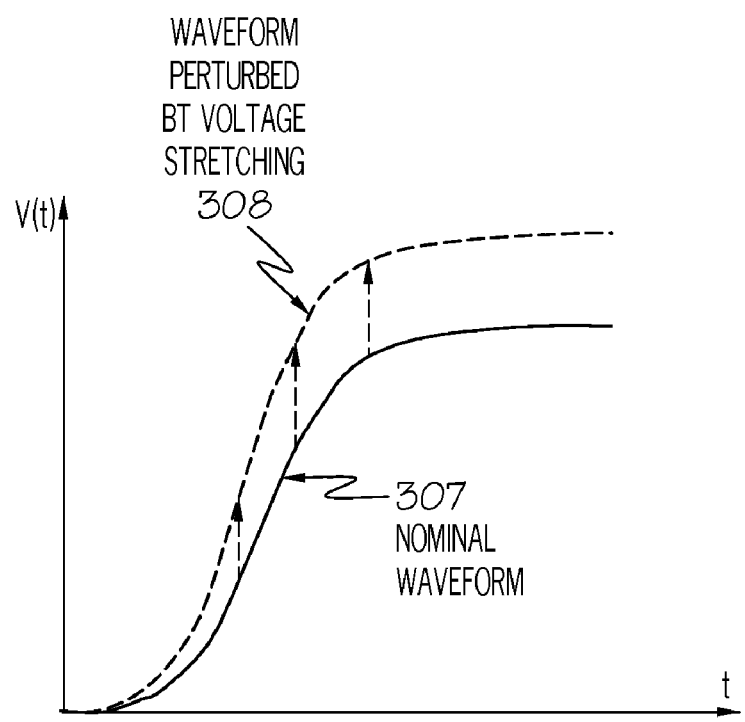

Furthermore, the transformation of the nominal waveform by voltage stretching operator $M_v$ is shown as follows in equation 6:

$$M_v(C):V_{nom}(t) \mapsto V(t)=V_{nom}(t)\cdot(1+C) \qquad (6)$$

where C defines the variation of the waveform voltage relative to its nominal value. C=0 means no voltage stretching and C=0.1 means that each voltage level is increased by 10% of its nominal value. So, if the nominal waveform, 307, transitions from 0 to Vdd then the stretched waveform, 308, transitions from 0 to 1.1 Vdd. Negative values of C will result in voltage level reduction (FIG. 3D).

One can approximate any arbitrary waveform transformation operator T with an optimal superposition of the four primitive waveform transformation operators (i.e., time shifting $S_t(B)$, time stretching $M_t(A)$, voltage shifting $S_v(D)$, and voltage stretching $M_v(C)$). A first order model approximation for an arbitrary waveform transformation operator T is shown in equation 7 as follows:

$$T=S_t(B) \circ M_t(A) \circ S_v(D) \circ M_v(C): V_{nom}(t) \mapsto V(t)= \\ (1+C)\cdot V_{nom}(t-A(t-t_{nom,0})-B)+DV_{dd} \qquad (7)$$

The main advantage of this representation is that if the nominal waveform $V_{nom}(t)$ is known, it is easy to compute the perturbed waveform $V(t)$. Moreover, as it is discussed later, one can easily compute the sensitivities of the crossing times to the process parameters. This will help to design efficient algorithms to propagate variational waveforms through gates and interconnects.

Note that the aforementioned primitive waveform transformation operators are selected since they are intuitive for constructing variational waveform model. Those skilled in the art will recognize that other primitive waveform transformation operators can be used, including complex ones with higher degrees of freedom which can better approximate arbitrary waveform transformations in a real circuit.

Furthermore, those skilled in the art will recognize that equation 7 can be represented in other formats. For example, equation 7 can be represented in the following format shown in FIG. 8:

$$V_{A,B,C,D}(t) = (1+C) \cdot V_{nom}(t - A(t - t_{nom,0}) - B) + DV_{dd,nom} \quad (8)$$

where $V_{dd,nom}$ is the nominal supply voltage value. Equation 8 is also referred as the first order linear transformation model since the waveform $V_{A,B,C,D}(t)$ is obtained from the nominal waveform $V_{nom}(t)$ by linear transformations of time and voltage dimensions. However, this equation includes significant amount of nonlinearity by assuming that the nominal waveform $V_{nom}(t)$ is an arbitrary waveform (i.e. not a saturated ramp). This equation can be also interpreted as a parameterized representation of waveform perturbation. Each parameter A, B, C, and D is in charge of its specific type of waveform perturbations (i.e. A for time stretching, B for time shifting, C for voltage stretching, and D for voltage shifting). Each set of parameter values A, B, C, D defines a unique waveform $V_{A,B,C,D}(t)$ obtained by the perturbation of the nominal waveform $V_{nom}(t)$. If A=0, B=0, C=0, D=0 the transformed waveform V(t) is exactly the same as the nominal waveform $V_{nom}(t)$.

In general, it may not be possible to represent every perturbed waveform from its nominal waveform in the form of equation 8. This representation only captures the most basic but essential types of variations, i.e. time and voltage shifting and stretching, in the linear format. However, those skilled in the art will recognize that other possible representations exist. For example, one possibility is to add more nonlinear stretching operators to model more degrees of freedom in the waveform variation as shown in equation 9:

$$V_{A,B,C,D}(t) = V_{nom}(t - A_1(t - t_{nom,0}) - A_2(t - t_{nom,0})^2 - \ldots - B) + \quad (9)$$
$$C_1 \cdot V_{nom}(t - A_1(t - t_{nom,0}) - A_2(t - t_{nom,0})^2 - \ldots - B) +$$
$$C_2 \cdot V_{nom}^2(t - A_1(t - t_{nom,0}) - A_2(t - t_{nom,0})^2 - \ldots - B) +$$
$$\ldots + DV_{dd,nom}$$

Due to the effect of environmental and process variation, signal waveforms in the real circuits are different from the computed nominal ones in the absence of variability. If the manufacturing processes are modeled with random variables, the digital signal waveforms can be represented as random functions. This implies that the perturbed waveform at a specific point in a design in one manufactured chip could be different from that at the same point in another manufactured chip. The shape of the waveforms is determined by the actual values of environmental and process parameters.

Referring to equation 8, parameters $A(X_1, X_2, \ldots)$, $B(X_1, X_2, \ldots)$, $C(X_1, X_2, \ldots)$, $D(X_1, X_2, \ldots)$ of variational waveforms are functions of random environmental and process parameters $X_1, X_2, \ldots$. Thus, as mentioned earlier, a variational waveform can be considered a random function which can be evaluated by the values of environmental and process parameters. Accordingly, the signal crossing time $t_k$ in the variational waveform depends on the parameters $X_1, X_2, \ldots$. Using variational waveform model $V(t, X_1, X_2, \ldots)$, one can calculate the sensitivity $$\frac{\partial t_k}{\partial X_i}$$

of crossing time $t_k$ to process parameter $X_i$ by computing the derivative of an implicit function $V(t,X_i)=V_k=\text{const}$, as follows in equation 10:

$$\frac{\partial V}{\partial t} dt + \frac{\partial V}{\partial X_1} dX_1 = 0 \quad (10)$$

Using equation 10 and collecting terms, the derivative of crossing time with respect to process parameter X is obtained as presented in equation 11.

$$\left. \frac{dt}{dX_i} \right|_{V=V_k} = -\frac{\frac{\partial V}{\partial X_i}}{\frac{\partial V}{\partial t}} \quad (11)$$

The voltage waveform, V(t), explicitly depends on the parameters $X_1, X_2, \ldots$ due to the dependency of A, B, C, D on the environmental and process parameters i.e. $A=A(X_1, X_2, \ldots)$, $B=B(X_1, X_2, \ldots)$, $C=C(X_1, X_2, \ldots)$, $D=D(X_1, X_2, \ldots)$. Therefore, chain ruling can be employed to differentiate the variational waveform with respect to the environmental and process parameters. By differentiating the variational waveform (using equation 8) and evaluating the sensitivities at the nominal corner, one can obtain the equations presented below:

$$\left. \frac{\partial V}{\partial t} \right|_{V(t)=V_{nom}(t)} = \dot{V}_{nom}(t) \quad (12)$$

$$\left. \frac{\partial V}{\partial X_i} \right|_{V(t)=V_{nom}(t)} = -\dot{V}_{nom}(t) \frac{\partial A}{\partial X_i}(t - t_0) - \quad (13)$$
$$\dot{V}_{nom}(t) \frac{\partial B}{\partial X_i} + V_{nom}(t) \frac{\partial C}{\partial X_i} + V_{dd} \frac{\partial D}{dX_i}$$

By substituting the above equations into equation 11 and collecting terms, one can obtain the sensitivity of waveform crossing time of voltage level $V_k$ to parameter $X_k$ evaluated at the nominal process corner as follows in equation 14:

$$\left. \frac{\partial t}{\partial X_i} \right|_{V(t)=V_{nom}(t)=V_k} = \quad (14)$$
$$\frac{\partial A}{\partial X_i}(t - t_0) + \frac{\partial B}{\partial X_i} - \frac{\partial C}{\partial X_i} \frac{V_{nom}(t)}{\dot{V}_{nom}(t)} - \frac{\partial D}{dX_i} \frac{V_{dd}}{\dot{V}_{nom}(t)}$$

Next, it is assumed that the parameters, A, B, C, D in equation 8 can be represented as a linear function of Gaussian process variations as shown in equations 15-18. Note that it is straightforward to extend the proposed technique to any other model other than the linear function of the Gaussian process variations. Suppose the parameters A, B, C, and D are in the following format:

$$A = \sum_{i=1}^{n} a_i \cdot \Delta X_i + a_{n+1} \Delta R_a \quad (15)$$

$$B = \sum_{i=1}^{n} b_i \cdot \Delta X_i + b_{n+1} \Delta R_b \quad (16)$$

$$C = \sum_{i=1}^{n} c_i \cdot \Delta X_i + c_{n+1} \Delta R_c \quad (17)$$

$$D = \sum_{i=1}^{n} d_i \cdot \Delta X_i + d_{n+1} \Delta R_d \quad (18)$$

where:
- $\Delta X_i = X_i - \hat{X}_i$ is the variation of $i^{th}$ source of variation, $X_i$, from its nominal value $\hat{X}_i$;
- $a_i, b_i, c_i, d_i$ are sensitivities of variational parameters A, B, C, D to parameter $X_i$;
- $\Delta R_a, \Delta R_b, \Delta R_c$, and $\Delta R_d$ are normalized (zero mean and unit sigma) random variable employed to model the uncorrelated variations in A, B, C, and D, respectively.
- $a_{n+1}, b_{n+1}, c_{n+1}, d_{n+1}$ are sensitivities of variational parameters A, B, C, D to their corresponding uncorrelated sources of variations.

If A, B, C, D are in the linear format, the sensitivity of waveform crossing time t at voltage level $V_k$ to parameter $X_i$ at the nominal corner is expressed as follows in equation 19:

$$\left.\frac{\partial t}{\partial X_i}\right|_{V(t)=V_{nom}(t)=V_k} = a_i(t-t_0) + b_i - c_i \frac{V_{nom}(t)}{\dot{V}_{nom}(t)} - d_i \frac{V_{dd}}{\dot{V}_{nom}(t)} \quad (19)$$

On the other hand, the crossing time $t_k$ of variational waveform V(t) can be approximated with a first order form as a function of process variation parameters as follows in equation 20:

$$t_k = \tau_{k,0} + \sum_{i=1}^{n} \tau_{k,i} \cdot \Delta X_i + \tau_{k,n+1} \Delta R_t \quad (20)$$

where:
- $\tau_{k,0}$, is the nominal value of the crossing time $t_k$;
- $\Delta X_i = X_i - \hat{X}_i$ is the variation of $i^{th}$ source of variation, $X_i$, from its nominal value $\hat{X}_i$;
- $\tau_{k,i}$ is the sensitivity of the crossing time $t_k$ to the parameter $X_i$;
- $\Delta R_t$ is the variation of the uncorrelated random parameter $R_t$.
- $\tau_{k,n+1}$ is the sensitivity of the crossing time $t_k$ to the uncorrelated variation $R_t$.

Therefore, given the coefficients $a_i, b_i, c_i, d_i$ of the variational waveform parameters A, B, C, and D (equations 15-18); each coefficient $\tau_{k,i}$ in equation 20 can be calculated using equation 19.

Parameterized block-based SSTA requires two main operations on signal models: propagation of signals through gates and interconnects and computation of the latest or earliest signal at any node with a fan-in of two or more. Below is a discussion of techniques that handle these operations on variational waveforms for SSTA.

Figure 4A:
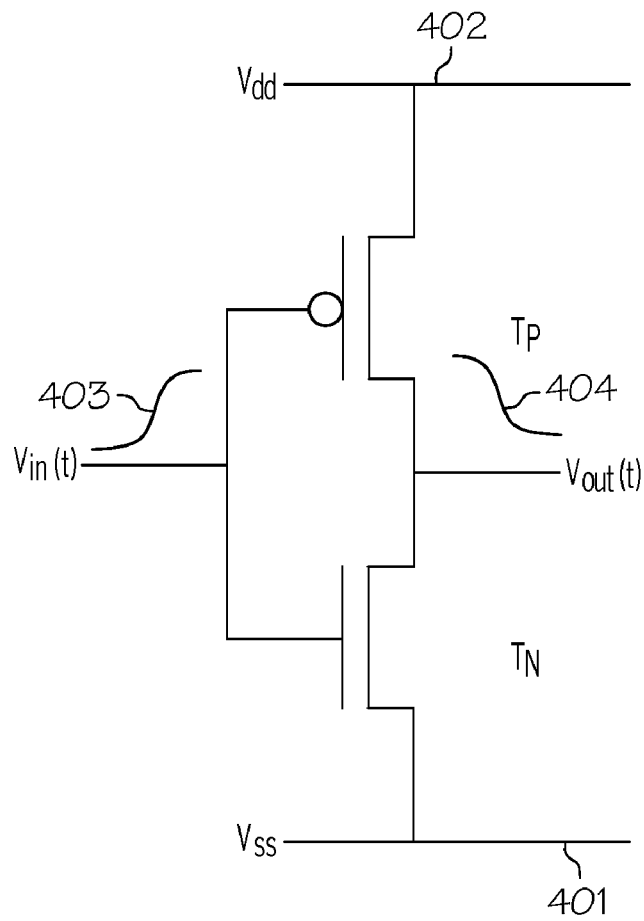
FIGS. 4A-4B present signal propagation through a CMOS gate and an interconnect.

Consider the transistor level representation of a CMOS inverter shown in FIG. 4A. If the leakage current is ignored, the steady state voltage level at the gate output terminal is either Vss (Ground voltage, 401) or Vdd (Power supply voltage, 402). Assume that the input waveform slew, 403, does not move outside its legal range (e.g., the range over which the inverter delay has been characterized) even due to the effect of environmental and process variations. Therefore, C and D terms in equation 8 for the output voltage waveform, 404 (i.e. the voltage shifting and stretching operators) are only functions of power (i.e. Vdd) and ground (i.e. Vss) voltage variations and do not depend on either the input waveform variations, 403, or gate parameters variations. Thus, C and D can be derived from equation 9 and equation 10 with the assumption that $V_{nom,low}=0$ (i.e. the nominal ground voltage value) and $V_{nom,high}=V_{dd,nom}$ (i.e. the nominal supply voltage value) as shown in equations 21 and 22. Note that $V_{low}$ is the actual value of ground voltage Vss and $V_{high}$ is the actual value of supply voltage, Vdd.

$$C = \frac{V_{dd} - V_{ss}}{V_{dd,nom}} - 1 \quad (21)$$

$$D = \frac{V_{ss} - V_{ss,nom}}{V_{dd,nom}} \quad (22)$$

Figure 4B:
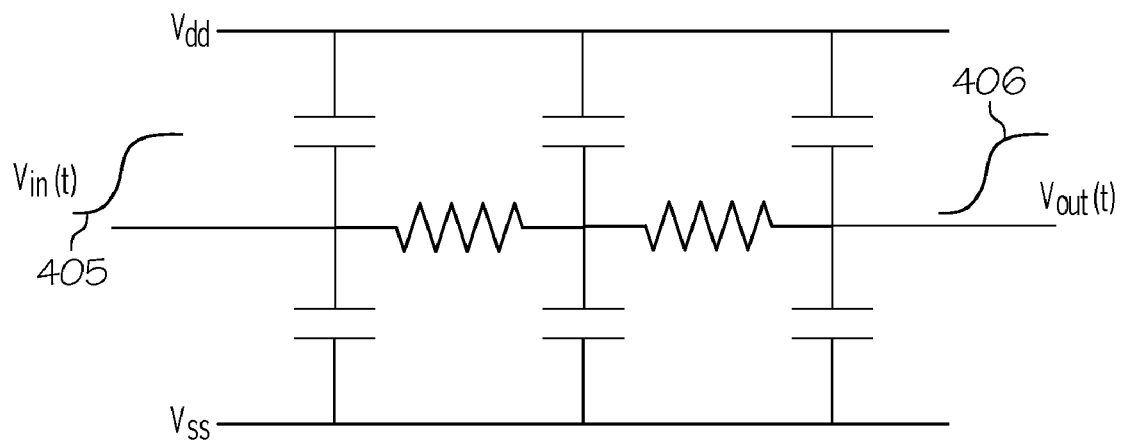

In the above equations, Vdd and Vss are in the first order form as a function of process variations. On the other hand, as shown in FIG. 4B, since interconnect does not affect the voltage levels, the steady state voltages at the source pin, 405, and sink pin, 406, of the interconnect are the same. As a result, the C and D terms of the variational waveform at the sink pin of the interconnect, $V_{out}(t)$ and the source pin of the interconnect, $V_{in}(t)$, are equal.

For any environmental and process parameters, different techniques (e.g. finite differencing or direct/adjoint sensitivity analysis) can be employed to compute the sensitivities of the voltage crossing times point which are not in the scope of this invention.

The following is a discussion of how to compute the time shifting and time stretching operators (i.e. A and B terms in equation 8) for propagating them throughout gates and interconnects. Consider the variational waveforms as shown in FIGS. 4A-4B. For any process parameter, sensitivities of the output waveform, 404 and 406, crossing times to environmental and process parameters can be computed using different techniques including finite differencing, direct or adjoint sensitivity analysis. When some advanced gate modeling techniques (such as current source modeling) are used, these sensitivities can be even computed analytically.

Figure 5:
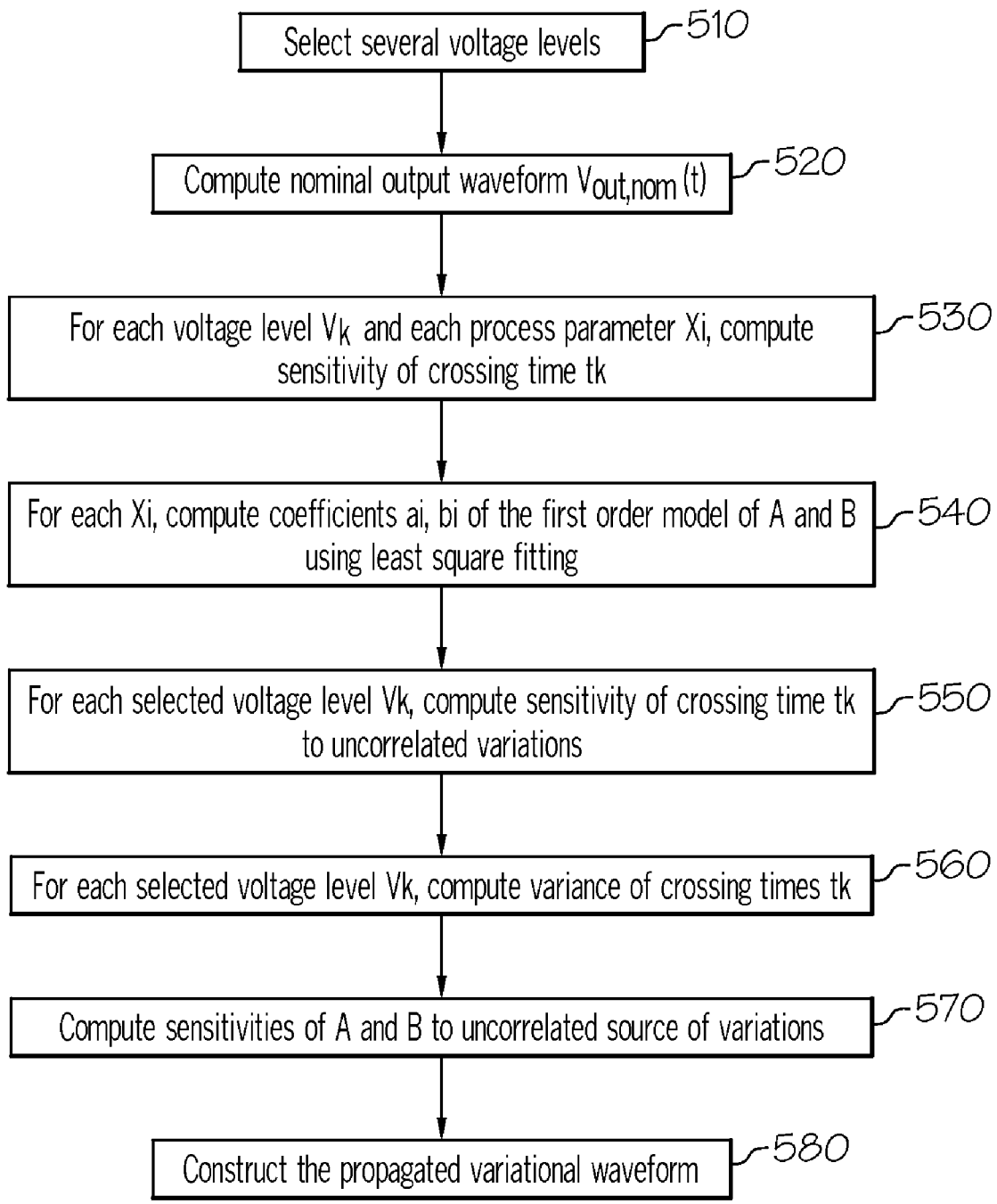
FIG. 5 presents the flowchart for calculating the time shifting and stretching operators in the canonical first order format according to one embodiment of this invention.

Referring to FIG. 5, there is a flow chart describing the time shifting and stretching operators (i.e. A, B terms) of the propagated variational waveform, 404 and 406. The process begins at 510 a set of voltage levels $V_1, V_2, \ldots$ is selected such that by propagating their corresponding crossing times $t_1, t_2, \ldots$, ends up having enough accuracy in the final timing results. Note that there is a trade off between memory requirements versus accuracy versus runtime for choosing the number of voltage levels. Apparently, the required number of voltage levels is a function of the CMOS technology and the waveform shapes.

As shown in FIG. 5, the next step 520 is to compute the nominal output waveform $V_{out,nom}(t)$ using deterministic (i.e.

non-variational) model of the gate or the interconnect. Following, in step 530, for each selected voltage level $V_k$ and each process parameter $X_i$, the sensitivity, $$s_{i,k} = \frac{\partial t}{\partial X_i}\bigg|_{V_{out,nom}(t)=V_k},$$

of crossing time $t_k$ of the output waveform $V_{out}(t)$ to each process parameter $X_i$ is computed and evaluated at the nominal process corners. In step 540, for each process parameter $X_i$, a least square fitting problem $P_{sens,i}$ is constructed to compute coefficients $a_i$, $b_i$, of the first order model of A and B to match sensitivities $s_{i,k}$ of crossing times $t_k$ for each voltage level $V_k$ of the output waveform $V_{out}(t)$. Then coefficients $a_i$, $b_i$, of first order forms A and B are computed by solving each least squares problem $P_i$.

In step 550, for each selected voltage level $V_k$, the sensitivity $s_{n+1,k}$ of crossing time $t_k$ to uncorrelated variations is computed as:

$$s_{n+1,k} = \sqrt{\sum_{\text{All uncorrelated variations}} s^2_{n+1,k,j}} \quad (23)$$

where $s_{n+1,k,j}$ is the sensitivity of crossing time $t_k$ to j-th source of uncorrelated variations. Summation is performed across all sources of uncorrelated variations: input variational waveform, ground and supply voltages, the gate (or interconnect) parameters and parameters of its load.

In step 560, for each selected voltage level $V_k$, the variance $\sigma_k^2$ of its crossing time is computed as $$\sum_{i=1}^{n=1} s_{i,k}^2.$$

In step 570, a least square fitting problem $P_{Var}$ is constructed to compute sensitivities $a_{n+1}$, $b_{n+1}$ of first order forms A, B to uncorrelated variations by matching variances $\sigma_k^2$ of crossing times $t_k$. Next, coefficients $a_{n+1}$, $b_{n+1}$ of first order canonical forms A, B are computed by solving least square problem $P_{Var}$. Next, using the computed first order forms of terms A and B, the propagated variational waveform is constructed in the canonical form as presented in 580.

Below is an explanation of the least square fitting problem $P_{sens,i}$ for computing coefficients $a_i$, $b_i$, of first order forms A and B. In this scenario, $V_1$, $V_2$, ... are m selected voltage levels; $t_1$, $t_2$, ... are m corresponding crossing times of the nominal output waveform; $s_{i,1}$, $s_{i,2}$, ... are sensitivities of crossing times to process parameter $X_i$. The coefficients $a_i$, $b_i$ of first order forms A, B are computed by minimizing the sum of squared errors of sensitivities at each voltage level as follows:

$$\sum_{k=1}^{m}\left(s_{i,k} - a_i(t_k - t_0) - b_i + c_i\frac{V_{nom}(t_k)}{\dot{V}_{nom}(t_k)} + d_i\frac{V_{dd,nom}}{\dot{V}_{nom}(t_k)}\right)^2 \xrightarrow[a_i,b_i]{} \min \quad (24)$$

If the variation of power and ground voltages is ignored, equation 24 can be simplified as:

$$\sum_{k=1}^{m}(s_{i,k} - a_i(t_k - t_0) - b_i)^2 \xrightarrow[a_i,b_i]{} \min \quad (25)$$

Equation 25 is a linear least squares problem. Thus, it can be solved efficiently since it only has two unknown variables, $a_i$, $b_i$, and a limited set of equations (i.e. the number of equations is equal to the number of selected voltage levels). If the crossing times for certain of the selected voltage levels $V_k$ of the waveform are known to have a greater influence on the behavior (e.g., delay) of circuits to which the waveform is applied as an input, the errors for these crossing times may be weighted more heavily in this and subsequent least squares problems, creating a result that more closely approximates the actual waveform around these points.

Next, the least squares fitting problem for computing sensitivities $a_{n+1}$, $b_{n+1}$ of canonical forms A, B to uncorrelated variations is clarified. In this scenario $V_1$, $V_2$, ... are m selected voltage levels; $t_1$, $t_2$, ... are m corresponding crossing times of the nominal output waveform; $\sigma_1^2$, $\sigma_2^2$, ... are variances of output waveform crossing times at the selected voltage levels; $a_1$, $b_1$, $a_2$, $b_2$, ..., $a_n$, $b_n$ are coefficients of first order forms A,B. Thus, coefficients $a_{n+1}$ and $b_{n+1}$ of first order forms A, B is computed by minimizing the sum of squared errors of crossing times variances:

$$\sum_{k=1}^{m}\left(\sigma_k^2 - \sum_{i=1}^{n} z_{i,k}^2 - y_k^2 - a_{n+1}^2(t_k - t_0)^2 - b_{n+1}^2\right)^2 \xrightarrow[a_{n+1}^2,b_{n+1}^2]{} \min \quad (26)$$

where:

$$z_{i,k} = a_i(t_k - t_0) + b_i - c_i\frac{V_{nom}(t_k)}{\dot{V}_{nom}(t_k)} - d_i\frac{V_{dd,nom}}{\dot{V}_{nom}(t_k)}$$

is the approximated sensitivity of k-th crossing time to process parameter $X_i$.

$$y_k^2 = c_{n+1}^2\left(\frac{V_{nom}(t_k)}{\dot{V}_{nom}(t_k)}\right)^2 + d_{n+1}^2\left(\frac{V_{dd,nom}}{\dot{V}_{nom}(t_k)}\right)^2$$

is the k-th crossing time variance component due to voltage shifting and scaling terms C, D.

Equation 26 is a linear least square problem with respect to unknown variables $a_{n+1}^2$ and $b_{n+1}^2$.

The algorithm presented in FIG. 5 requires sensitivities of output waveform crossing times to process variation parameters at nominal process corner. These values can be obtained from variational model of gates and interconnects.

The following is a discussion of an algorithm for computing statistical maximum/minimum of two variational waveforms. These operations are required to calculate the latest/earliest signal at any node with the fan-in of two or more in block-based SSTA. The discussion is limited to linear approximation of statistical minimum/maximum operation and first-order variational representation of time and voltage shifting and scaling terms. However, it is possible to construct an algorithm for higher order approximation of statistical minimum and maximum operation and higher order approximation of shifting and scaling terms.

As an example, consider a two input CMOS gate and two variational waveforms v1(t) and v2(t) which are separately propagated from the two gate input terminals to its output terminal using the technique described above. The goal is to compute the best fitted variational waveform vmax(t) (i.e. in the form of equation (8) which approximates the statistical maximums of v1(t) and v2(t) with the minimum error.

As explained above, the voltage shifting (C) and voltage stretching (D) of v1(t) and v2(t) must be equal since these terms are functions of the gate power supply and ground voltage variations other than the gate parameters and the gate variational input waveforms. Therefore, the resulted variational maximum waveform will have the same voltage shifting and voltage scaling terms C, D. As a result, only the time shifting and time stretching terms A, B of the variational maximum waveform is computed. To do that, a mixed flavor of the technique presented in FIG. 5 and the well-known statistical max operation is employed. Crossing times of the two waveforms whose max is being computed are represented with their first order canonical forms. Therefore, the statistical maximum of the corresponding crossing time can be computed. Next, the time shifting and time stretching parameters of the variational waveform is computed by fitting sensitivities and standard deviations of the crossing times as explained in FIG. 6.

Figure 6:
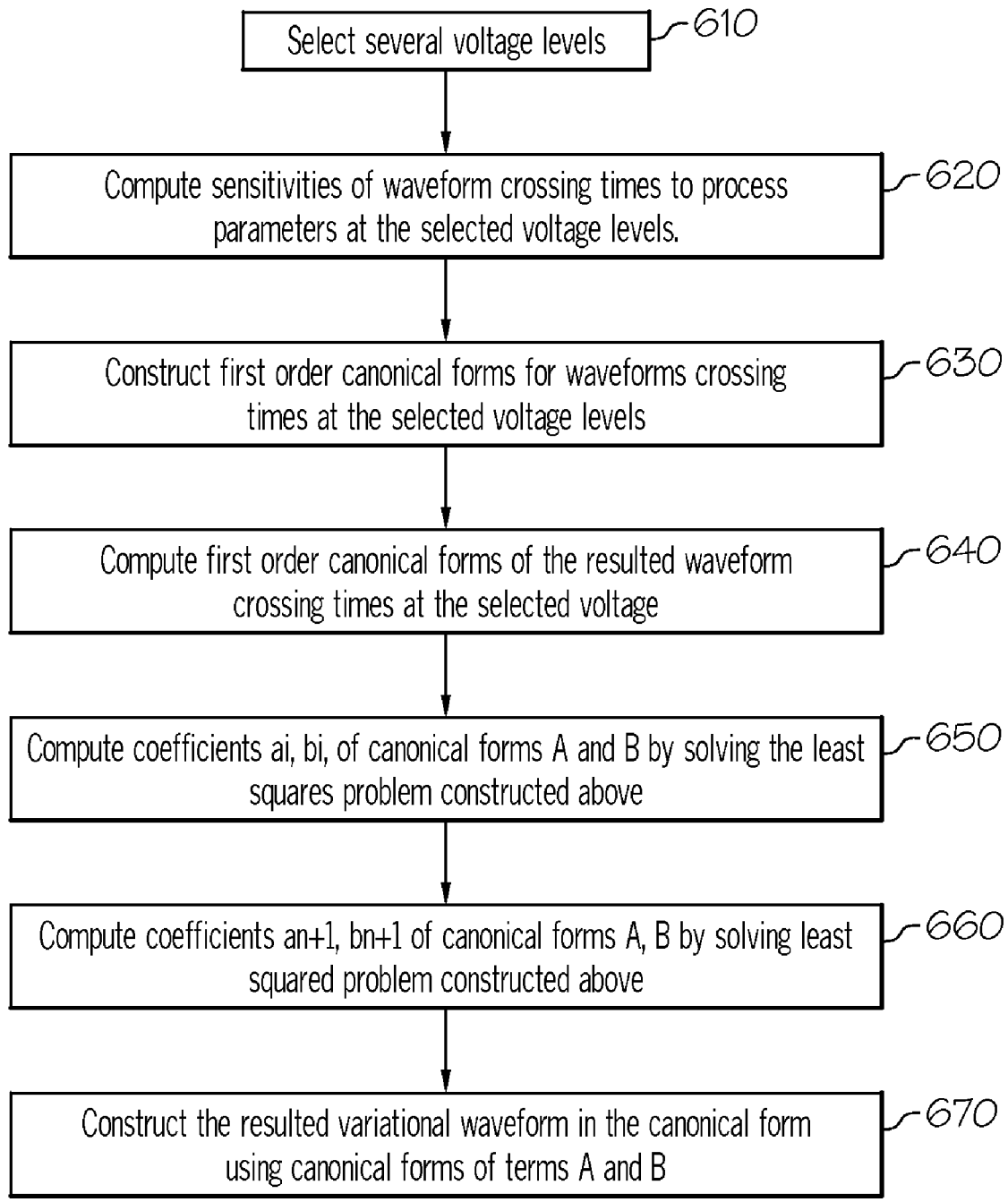
FIG. 6 presents the flowchart for calculating the statistical maximum of two variational waveforms according to one embodiment of this invention.

Referring to FIG. 6, a set of voltage levels $V_1, V_2, \ldots$ is selected at 610 such that by propagating their corresponding crossing times $t_1, t_2, \ldots$, there is enough accuracy in the final arrival times results. Note that there is a trade off between accuracy versus runtime for choosing the number of voltage levels. Apparently, the required number of voltage levels is a function of the CMOS technology and the waveform shapes.

Next, in 620, sensitivities of waveform crossing times to process parameters at the selected voltage levels are computed. This will help to construct the first order canonical form for waveforms crossing times at the selected voltage levels, as explained in step 630. In step 640, the first order canonical form of the maximum of the resulted waveform crossing times at the selected voltage levels is computed by applying a statistical MAX operation to canonical forms of the input waveforms crossing times. The resulting canonical forms contain sensitivities of resulted waveform crossing times to process parameters. Then, in step 650, for each process parameter $X_i$, a least square fitting problem is constructed to compute coefficients ai, bi, of canonical forms of the resulted waveform time shifting and time stretching terms A and B by matching sensitivities of crossing times for each crossing point of the variational waveform. This will help to compute coefficients ai, bi, of canonical forms A and B by solving the least square fitting problem.

In step 660 a least square fitting problem is constructed to compute the sensitivities an+1 and bn+1 of canonical forms A, B to uncorrelated variations by matching standard deviations of crossing times and, thereby, compute coefficients $a_{n+1}, b_{n+1}$ of canonical forms A, B by solving the least square fitting problem. Finally, the resulted variational waveform in the canonical form is computed by using canonical forms of terms A and B in step 670. Similarly, one can compute the statistical minimum of two variational waveforms in the first order canonical form which is critical for calculating the earliest arrival times in a timing run.

Figure 7:
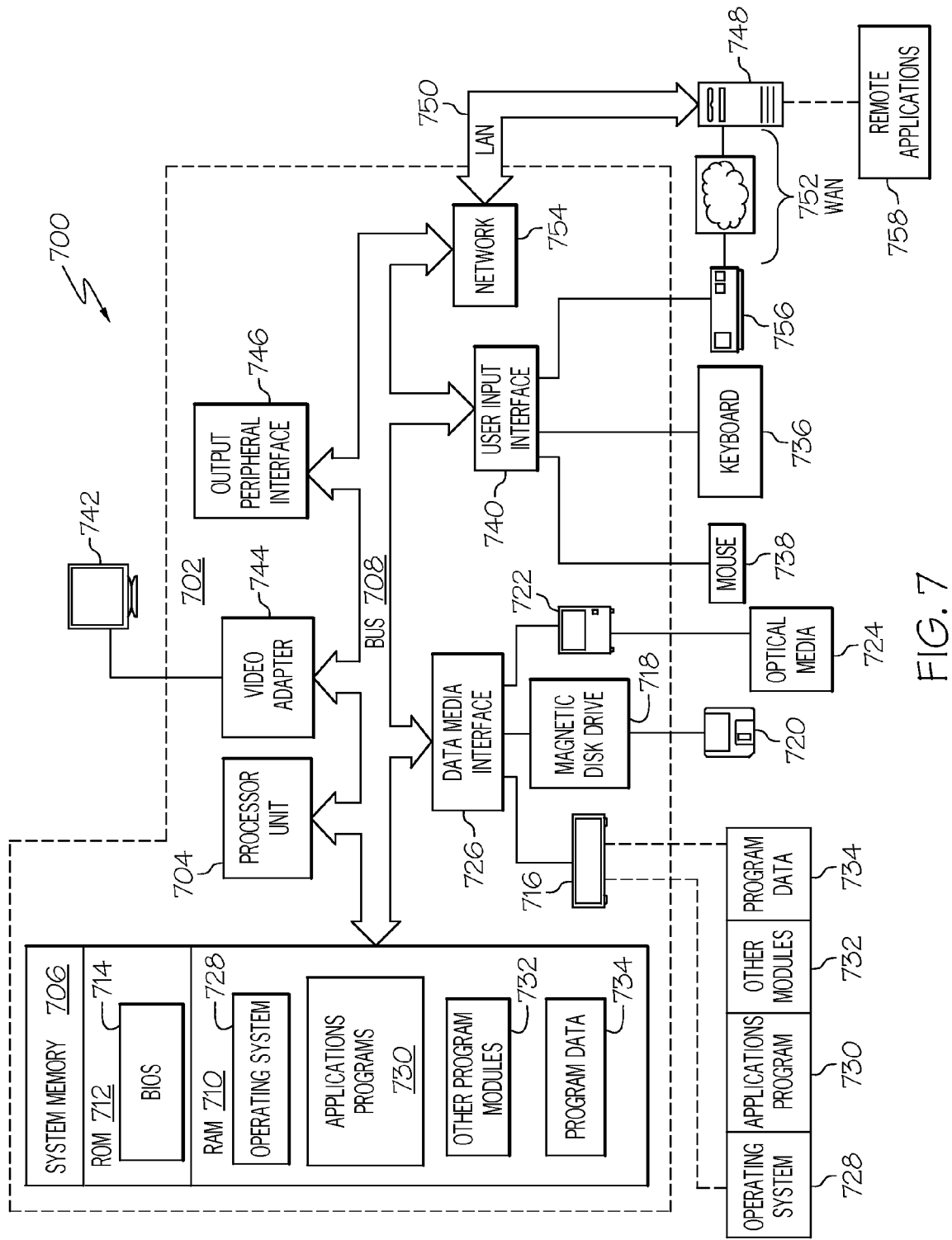
FIG. 7 shows a schematic of an exemplary computing environment in which elements of the SSTA tool of this invention may operate.

FIG. 7 shows a schematic of an exemplary computing environment in which a SSTA tool that represents and propagates a variational voltage waveform according to one embodiment of this invention may operate. The exemplary computing environment 700 is only one example of a suitable computing environment and is not intended to suggest any limitation as to the scope of use or functionality of the approach described herein. Neither should the computing environment 700 be interpreted as having any dependency or requirement relating to any one or combination of components illustrated in FIG. 7.

In the computing environment 700 there is a computer 702 which is operational with numerous other general purpose or special purpose computing system environments or configurations. Examples of well known computing systems, environments, and/or configurations that may be suitable for use with an exemplary computer 702 include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The exemplary computer 702 may be described in the general context of computer-executable instructions, such as program modules, being executed by a computer. Generally, program modules include routines, programs, objects, components, logic, data structures, and so on, that performs particular tasks or implements particular abstract data types. The exemplary computer 702 may be practiced in distributed computing environments where tasks are performed by remote processing devices that are linked through a communications network. In a distributed computing environment, program modules may be located in both local and remote computer storage media including memory storage devices.

As shown in FIG. 7, the computer 702 in the computing environment 700 is shown in the form of a general-purpose computing device. The components of computer 702 may include, but are not limited to, one or more processors or processing units 704, a system memory 706, and a bus 708 that couples various system components including the system memory 706 to the processor 704.

Bus 708 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer 702 typically includes a variety of computer readable media. Such media may be any available media that is accessible by computer 702, and it includes both volatile and non-volatile media, removable and non-removable media.

In FIG. 7, the system memory 706 includes computer readable media in the form of volatile memory, such as random access memory (RAM) 710, and/or non-volatile memory, such as ROM 712. A BIOS 714 containing the basic routines that help to transfer information between elements within computer 702, such as during start-up, is stored in ROM 712. RAM 710 typically contains data and/or program modules that are immediately accessible to and/or presently operated on by processor 704.

Computer 702 may further include other removable/non-removable, volatile/non-volatile computer storage media. By way of example only, FIG. 7 illustrates a hard disk drive 716 for reading from and writing to a non-removable, non-volatile magnetic media (not shown and typically called a "hard drive"), a magnetic disk drive 718 for reading from and writing to a removable, non-volatile magnetic disk 720 (e.g., a "floppy disk"), and an optical disk drive 722 for reading from or writing to a removable, non-volatile optical disk 724 such as a CD-ROM, DVD-ROM or other optical media. The hard disk drive 716, magnetic disk drive 718, and optical disk drive 722 are each connected to bus 708 by one or more data media interfaces 726.

The drives and their associated computer-readable media provide nonvolatile storage of computer readable instructions, data structures, program modules, and other data for computer 702. Although the exemplary environment described herein employs a hard disk 716, a removable magnetic disk 718 and a removable optical disk 722, it should be appreciated by those skilled in the art that other types of computer readable media which can store data that is accessible by a computer, such as magnetic cassettes, flash memory cards, digital video disks, RAMs, ROM, and the like, may also be used in the exemplary operating environment.

A number of program modules may be stored on the hard disk 716, magnetic disk 720, optical disk 722, ROM 712, or RAM 710, including, by way of example, and not limitation, an operating system 728, one or more application programs 730, other program modules 732, and program data 734. Each of the operating system 728, one or more application programs 730 other program modules 732, and program data 734 or some combination thereof, may include an implementation of a SSTA that represents and propagates a variational voltage waveform according to one embodiment of this invention.

A user may enter commands and information into computer 702 through optional input devices such as a keyboard 736 and a pointing device 738 (such as a "mouse"). Other input devices (not shown) may include a microphone, joystick, game pad, satellite dish, serial port, scanner, camera, or the like. These and other input devices are connected to the processor unit 704 through a user input interface 740 that is coupled to bus 708, but may be connected by other interface and bus structures, such as a parallel port, game port, or a universal serial bus (USB).

An optional monitor 742 or other type of display device is also connected to bus 708 via an interface, such as a video adapter 744. In addition to the monitor, personal computers typically include other peripheral output devices (not shown), such as speakers and printers, which may be connected through output peripheral interface 746.

Computer 702 may operate in a networked environment using logical connections to one or more remote computers, such as a remote server/computer 748. Remote computer 748 may include many or all of the elements and features described herein relative to computer 702.

Logical connections shown in FIG. 7 are a local area network (LAN) 750 and a general wide area network (WAN) 752. Such networking environments are commonplace in offices, enterprise-wide computer networks, intranets, and the Internet. When used in a LAN networking environment, the computer 702 is connected to LAN 750 via network interface or adapter 754. When used in a WAN networking environment, the computer typically includes a modem 756 or other means for establishing communications over the WAN 752. The modem, which may be internal or external, may be connected to the system bus 708 via the user input interface 740 or other appropriate mechanism.

In a networked environment, program modules depicted relative to the personal computer 702, or portions thereof, may be stored in a remote memory storage device. By way of example, and not limitation, FIG. 7 illustrates remote application programs 758 as residing on a memory device of remote computer 748. It will be appreciated that the network connections shown and described are exemplary and other means of establishing a communications link between the computers may be used.

An implementation of an exemplary computer 702 may be stored on or transmitted across some form of computer readable media. Computer readable media can be any available media that can be accessed by a computer. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

It is apparent that there has been provided by this invention an approach for representing and propagating a variational voltage waveform in statistical static timing analysis of digital circuits. While the invention has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method, performed on a computer system, for parameterized statistical static timing analysis of a digital circuit, the method comprising:

using the computer system to perform the following:

developing a variational waveform model that approximates all possible waveforms that may occur at nodes of the digital circuit for all possible combinations of values of process and environmental parameters used to represent sources of variation that may effect the digital circuit, wherein the variational waveform model is a random function that models the process and environmental parameters as random variables, wherein all of the possible waveforms are constructed from a nominal waveform containing nominal values of the process and environmental parameters, the nominal waveform having a shape that can change to any of the all possible waveforms as a function of the process and environmental parameters, the change in shape of the nominal waveform to any of the all possible waveforms is facilitated by a plurality of waveform transformation operators parameterized by the process and environmental parameters, wherein the nominal waveform and the parameterized plurality of waveform transformation operators describe all of the possible waveforms that may occur at the nodes of the digital circuit for all of the possible combinations of values of the process and environmental parameters propagating the variational waveform model comprising the nominal waveform and the parameterized plurality of waveform transformation operators that describe all of the possible waveforms that may occur at the nodes of the digital circuit for all of the possible combinations of values of the process and environmental parameters through a timing arc from at least one input to at least one output of the digital circuit; and determining circuit timing characteristics as the variational waveform model comprising the nominal waveform and the parameterized plurality of waveform transformation operators is propagated through the timing arc from at least one input to at least one output of the digital circuit, wherein the determined circuit timing characteristics are based on statistical properties of variations of the process and environmental parameters that may effect the digital circuit.

2. The method according to claim 1, wherein the plurality of waveform transformation operators comprise time shifting, time stretching, voltage shifting and voltage stretching operators.

3. The method according to claim 1, wherein the plurality of waveform transformation operators are represented in a canonical format.

4. The method according to claim 1, wherein the propagating of the variational waveform model comprises determining sensitivities of each of the plurality of waveform transformation operators to a particular source of variation through the timing arc.

5. The method according to claim 1, wherein the determining of circuit timing characteristics comprises determining a statistical maximum and/or statistical minimum of two variational waveforms through the timing arc.

6. A tangible computer-readable storage medium storing computer instructions, which when executed, enables a computer system to perform a parameterized statistical static timing analysis of a digital circuit, the computer instructions comprising:

developing a variational waveform model that approximates all possible waveforms that may occur at nodes of the digital circuit for all possible combinations of values of process and environmental parameters used to represent sources of variation that may effect the digital circuit, wherein the variational waveform model is a random function that models the process and environmental parameters as random variables, wherein all of the possible waveforms are constructed from a nominal waveform containing nominal values of the process and environmental parameters, the nominal waveform having a shape that can change to any of the all possible waveforms as a function of the process and environmental parameters, the change in shape of the nominal waveform to any of the all possible waveforms is facilitated by a plurality of waveform transformation operators parameterized by the process and environmental parameters, wherein the nominal waveform and the parameterized plurality of waveform transformation operators describe all of the possible waveforms that may occur at the nodes of the digital circuit for all of the possible combinations of values of the process and environmental parameters propagating the variational waveform model comprising the nominal waveform and the parameterized plurality of waveform transformation operators that describe all of the possible waveforms that may occur at the nodes of the digital circuit for all of the possible combinations of values of the process and environmental parameters through a timing arc from at least one input to at least one output of the digital circuit; and determining circuit timing characteristics as the variational waveform model comprising the nominal waveform and the parameterized plurality of waveform transformation operators is propagated through the timing arc from at least one input to at least one output of the digital circuit, wherein the determined circuit timing characteristics are based on statistical properties of variations of the process and environmental parameters that may effect the digital circuit.

7. The computer-readable storage medium according to claim 6, wherein the plurality of waveform transformation operators comprise time shifting, time stretching, voltage shifting and voltage stretching operators.

8. The computer-readable storage medium according to claim 6, wherein the plurality of waveform transformation operators are represented in a canonical format.

9. The computer-readable storage medium according to claim 6, wherein the propagating of the variational waveform model comprises instructions for determining sensitivities of each of the plurality of waveform transformation operators to a particular source of variation through the timing arc.

10. The computer-readable storage medium according to claim 6, wherein the determining of circuit timing characteristics comprises instructions for determining a statistical maximum and/or statistical minimum of two variational waveforms through the timing arc.

11. A computer system for analyzing digital circuit designs, comprising:

at least one processing unit;

memory operably associated with the at least one processing unit; and a parameterized statistical static timing analysis tool storable in memory and executable by the at least one processing unit, the parameterized statistical static timing analysis tool comprising:

a variational waveform modeling component that is configured to generate a variational waveform model that approximates all possible waveforms that may occur at nodes of the digital circuit for all possible combinations of values of process and environmental parameters used to represent sources of variation that may effect the digital circuit, wherein the variational waveform model is a random function that models the process and environmental parameters as random variables, wherein all of the possible waveforms are constructed from a nominal waveform containing nominal values of the process and environmental parameters, the nominal waveform having a shape that can change to any of the all possible waveforms as a function of the process and environmental parameters, the change in shape of the nominal waveform to any of the all possible waveforms is facilitated by a plurality of waveform transformation operators parameterized by the process and environmental parameters, wherein the nominal waveform and the parameterized plurality of waveform transformation operators describe all of the possible waveforms that may occur at the nodes of the digital circuit for all of the possible combinations of values of the process and environmental parameters a variational waveform propagating component configured to propagate the variational waveform model comprising the nominal waveform and the parameterized plurality of waveform transformation operators that describe all of the possible waveforms that may occur at the nodes of the digital circuit for all of the possible combinations of values of the process and environmental parameters through a timing arc from at least one input to at least one output of the digital circuit; and a circuit timing characteristics determination component configured to determine circuit timing characteristics as the variational waveform model comprising the nominal waveform and the parameterized plurality of waveform transformation operators is propagated through the timing arc from at least one input to at least one output of the digital circuit, wherein the determined circuit timing characteristics are based on statistical properties of variations of the process and environmental parameters that may effect the digital circuit.

12. The computer system according to claim 11, wherein the plurality of waveform transformation operators comprise time shifting, time stretching, voltage shifting and voltage stretching operators.

13. The computer system according to claim 11, wherein the plurality of waveform transformation operators are represented in a canonical format.

14. The computer system according to claim 11, wherein the circuit timing characteristics determination component determines sensitivities of each of the plurality of waveform transformation operators to a particular source of variation through the timing arc.

15. The computer system according to claim 11, wherein the determining of circuit timing characteristics comprises determining a statistical maximum and/or statistical minimum of two variational waveforms through the timing arc.

* * * * *